United States Patent
Joshi

(10) Patent No.: US 10,461,668 B2
(45) Date of Patent: Oct. 29, 2019

(54) SYSTEMS FOR PROTECTING AND MONITORING POWER ELECTRONIC DEVICES

(71) Applicant: Toyota Motor Engineering & Manufacturing North America, Inc., Erlanger, KY (US)

(72) Inventor: Shailesh N. Joshi, Ann Arbor, MI (US)

(73) Assignee: TOYOTA MOTOR ENGINEERING & MANUFACTURING NORTH AMERICA, INC., Plano, TX (US)

(*) Notice: Subject to any disclaimer, the term of this patent is extended or adjusted under 35 U.S.C. 154(b) by 195 days.

(21) Appl. No.: 15/808,020

(22) Filed: Nov. 9, 2017

(65) Prior Publication Data

US 2019/0140560 A1    May 9, 2019

(51) Int. Cl.
| | |
|---|---|
| H01L 41/09 | (2006.01) |
| H02N 2/06 | (2006.01) |
| H01L 41/187 | (2006.01) |
| H01L 29/16 | (2006.01) |

(52) U.S. Cl.
CPC ......... *H02N 2/062* (2013.01); *H01L 29/1608* (2013.01); *H01L 41/1876* (2013.01)

(58) Field of Classification Search
CPC .. H02N 2/602; H01L 29/1608; H01L 41/1876
USPC .......................................... 310/311, 328, 346
See application file for complete search history.

(56) References Cited

U.S. PATENT DOCUMENTS

| | | | |
|---|---|---|---|
| 7,362,038 B1 * | 4/2008 | Jang ..................... | H03H 9/0542 |
| | | | 310/344 |
| 9,557,229 B2 | 1/2017 | Dumitru et al. | |
| 2007/0046142 A1 | 3/2007 | Obara et al. | |
| 2007/0170813 A1 | 7/2007 | Takayama et al. | |
| 2018/0277527 A1 * | 9/2018 | Yota ..................... | H01L 25/16 |

FOREIGN PATENT DOCUMENTS

| | | | |
|---|---|---|---|
| CN | 103346753 A | 10/2013 | |
| EP | 0823780 A1 * | 11/1998 | ............... H03H 9/02 |
| EP | 1241783 A1 | 9/2002 | |
| JP | 2016208367 A | 12/2016 | |

* cited by examiner

*Primary Examiner* — Thomas M Dougherty
(74) *Attorney, Agent, or Firm* — Dinsmore & Shohl LLP

(57) ABSTRACT

A system for protecting a power electronic device is provided. The system includes a power electronic device and a controller. The power electronic device includes a piezoelectric substrate, a metal substrate coupled to the piezoelectric substrate, a semiconductor device, and a bonding layer positioned between the metal substrate and the semiconductor device such that the metal substrate is bonded to the semiconductor device. The controller includes a power supply, one or more processors, and one or more memory modules storing computer readable and executable instructions. The computer readable and executable instructions, when executed by the one or more processors, cause the controller to: receive a temperature of the power electronic device, and provide a voltage determined based on the temperature of the power electronic device across the piezoelectric substrate.

20 Claims, 3 Drawing Sheets

SYSTEMS FOR PROTECTING AND MONITORING POWER ELECTRONIC DEVICES

TECHNICAL FIELD

The present specification generally relates to systems for protecting and monitoring power electronic devices and, more specifically, to protecting and monitoring power electronic devices by attaching piezoelectric substrates to power electronic devices.

BACKGROUND

A power electronic device includes a metal substrate and a semiconductor device bonded to the metal substrate. When the operating temperature of the power electronic device increases, thermal stresses caused by coefficient of thermal expansion (CTE) mismatch between the metal substrate and the semiconductor device increase. The increase in thermal stresses can result in cyclic strain (i.e., deformation) and fatigue failure in boding material between the metal substrate and the semiconductor device.

Accordingly, a need exists for preventing the cyclic strain and fatigue failure in bonding material.

SUMMARY

In one embodiment, a system includes a power electronic device and a controller. The power electronic device includes a piezoelectric substrate, a metal substrate coupled to the piezoelectric substrate, a semiconductor device, and a bonding layer positioned between the metal substrate and the semiconductor device such that the metal substrate is bonded to the semiconductor device. The controller includes a power supply, one or more processors, and one or more memory modules storing computer readable and executable instructions. The computer readable and executable instructions, when executed by the one or more processors, cause the controller to: receive a temperature of the power electronic device, and provide a voltage determined based on the temperature of the power electronic device across the piezoelectric substrate.

According to another embodiment, a power electronic device includes a piezoelectric substrate, a metal substrate coupled to the piezoelectric substrate, a semiconductor device, and a bonding layer positioned between the metal substrate and the semiconductor device such that the metal substrate is bonded to the semiconductor device. The piezoelectric substrate is configured to generate a mechanical strain in response to electric current passing through the piezoelectric substrate.

According to another embodiment, a system for monitoring a defect in a power electronic device is provided. The system includes a power electronic device and a controller. The power electronic device includes a piezoelectric substrate, a metal substrate coupled to the piezoelectric substrate, a semiconductor device, and a bonding layer positioned between the metal substrate and the semiconductor device such that the metal substrate is bonded to the semiconductor device. The controller includes one or more processors, and one or more memory modules storing computer readable and executable instructions which, when executed by the one or more processors, cause the controller to: determine whether a voltage across the piezoelectric substrate changes; and determine that the power electronic device has a defect in response to determination that the voltage across the piezoelectric substrate changes.

These and additional features provided by the embodiments described herein will be more fully understood in view of the following detailed description in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments described herein relate to systems for protecting and monitoring power electronic devices. The system includes a power electronic device and a controller. The power electronic device includes a piezoelectric substrate, a metal substrate coupled to the piezoelectric substrate, a semiconductor device, and a bonding layer positioned between the metal substrate and the semiconductor device such that the metal substrate is bonded to the semiconductor device. The controller includes a power supply, one or more processors, and one or more memory modules storing computer readable and executable instructions. The computer readable and executable instructions, when executed by the one or more processors, cause the controller to: receive a temperature of the power electronic device, and provide a voltage determined based on the temperature of the power electronic device across the piezoelectric substrate. Various embodiments of methods and systems for protecting and monitoring power electronic devices will be described in further detail herein with specific reference to the appended drawings.

Figure 1:
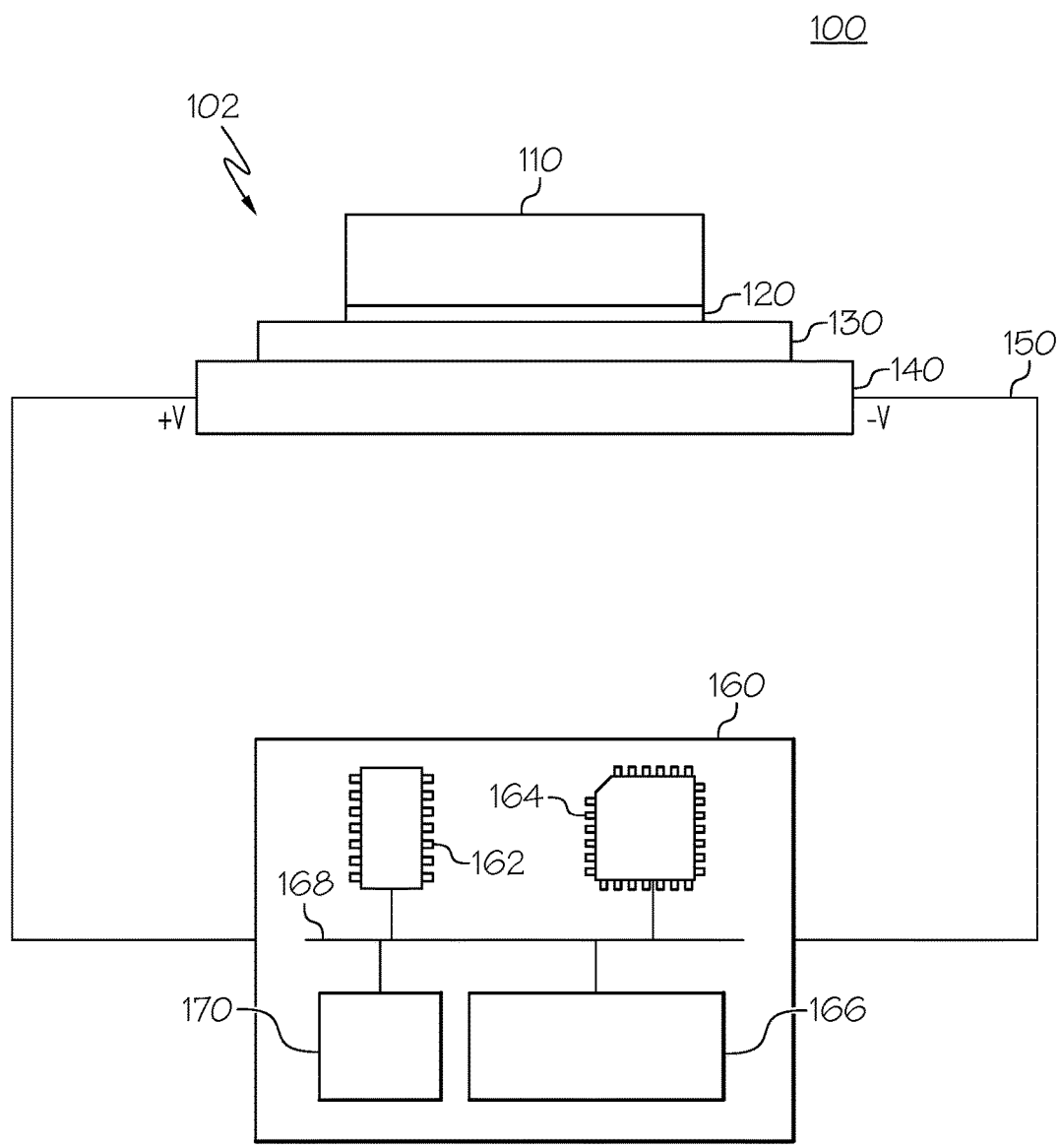
FIG. 1 schematically depicts a system for protecting a power electronic device, according to one or more embodiments described herein.

Referring now to FIG. 1, an embodiment of a system 100 for protecting a power electronic device 102 is schematically depicted. The system 100 includes the power electronic device 102 and a controller 160. The power electronic device 102 may be included in a vehicle system such as a hybrid vehicle system or an electric vehicle system. The power electronic device 102 may be a silicon carbide (SiC) power electronic device, or a silicon (Si) power electronic device. SiC is a wide-bandgap semiconductor, and SiC-based power switches can be used in automotive electrical subsystems. The power electronic device 102 includes a semiconductor device 110, a bonding layer 120, a metal substrate 130, and a piezoelectric substrate 140. The metal substrate 130 is coupled to the piezoelectric substrate 140 (e.g., such as embodiments in which the metal substrate 130 is deposited on the piezoelectric substrate 140). The semiconductor device 110 and the metal substrate 130 are bonded to each other through the bonding layer 120.

Figure 2A:
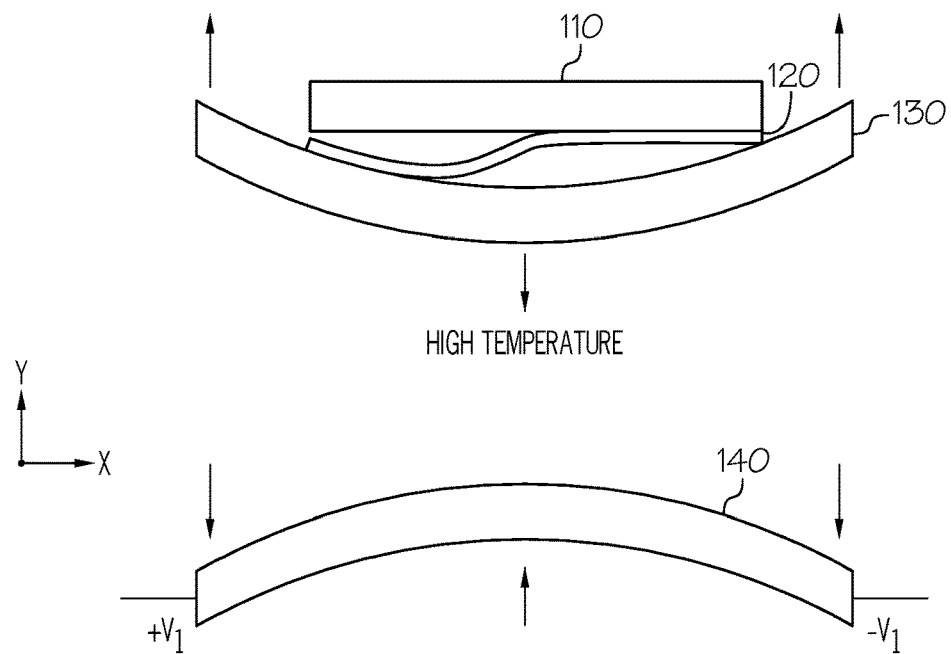
FIG. 2A depicts a metal substrate and a piezoelectric substrate subject to mechanical strains, according to one or more embodiments described herein.

The bonding layer 120 may be a solder layer. The bonding layer 120 may be subject to thermal stresses caused by coefficient of thermal expansion (CTE) mismatch between the metal substrate 130 and the semiconductor device 110, as the operating temperature of the power electronic device 102 increases. For example, when the metal substrate 130 is bonded to the semiconductor device 110, but not coupled to the piezoelectric substrate 140, the metal substrate 130 may be deformed as shown in FIG. 2A while the semiconductor device 110 maintains its shape or is deformed less relative to the metal substrate 130, as the operating temperature of the power electronic device increases. The CTE mismatch between the metal substrate 130 and the semiconductor device 110 increases thermal stresses to the bonding layer 120, thus eventually causing deformation and fatigue failure in the bonding layer 120.

Figure 2B:
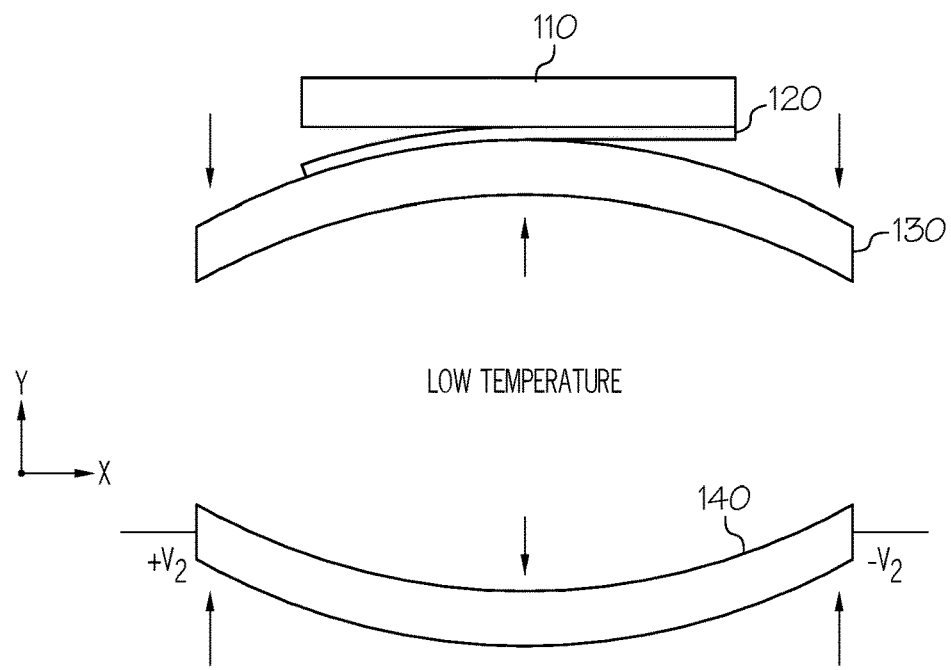
FIG. 2B depicts a metal substrate and a piezoelectric substrate subject to mechanical strains, according to one or more embodiments described herein.

In some embodiments, as the operating temperature of the power electronic device 102 increases, both ends of the metal substrate 130 are subject to mechanical strains in +y direction, and the center of the metal substrate 130 is subject to a mechanical strain in −y direction as shown in FIG. 2A. In some embodiments, as the operating temperature of the power electronic device 102 decreases, for example, the operating temperature becomes less than a room temperature, the metal substrate 130 may be deformed as shown in FIG. 2B. The both ends of the metal substrate 130 are subject to mechanical strains in −y direction, and the center of the metal substrate 130 is subject to a mechanical strain in +y direction.

In order to prevent the metal substrate 130 from being deformed such that the bonding layer 120 is not subject to cyclic strain and fatigue failure, the piezoelectric substrate 140 is attached to the metal substrate 130 as shown in FIG. 1, and electric current is applied to the piezoelectric substrate 140 in order to induce a mechanical strain in a direction opposite to the mechanical strain applied to the metal substrate 130.

The piezoelectric substrate 140 may be a thin piezoelectric substrate (e.g., a lead zirconate titanate (PZT) system). The piezoelectric substrate 140 may be deformed by a mechanical strain caused by an electric current passing through the piezoelectric substrate. In embodiments, when the piezoelectric substrate 140 is not attached to the metal substrate 130, the piezoelectric substrate 140 may be deformed into a convex shape as shown in FIG. 2A when the voltage applied across the piezoelectric substrate 140 is higher than a predetermined voltage. The degree of deformation may be a function of the voltage applied (e.g., the degree is proportional to the voltage applied). The piezoelectric substrate 140 may be deformed into a concave shape as shown in FIG. 2B when the voltage applied across the piezoelectric substrate 140 is lower than the predetermined voltage.

In embodiments, when the piezoelectric substrate 140 is attached to the metal substrate 130 as shown in FIG. 1, a mechanical strain applied to the piezoelectric substrate 140 at least partially cancels out or reduces the mechanical strain applied to the metal substrate 130. Thus, the metal substrate 130 is rarely deformed even when the operating temperature of the power electronic device 102 increases above a predetermined temperature or decreases below the predetermine temperature. Thus, the system 100 reduces the likelihood that the bonding layer 120 is subject to cyclic strain and fatigue failure.

The controller 160 includes one or more processors 162, one or more memory modules 164, a temperature sensor 166, a communication path 168, and a power supply 170. The various components of the system 100 will now be described.

The controller 160 includes one or more processors 162 and one or more memory modules 164 to which various components are communicatively coupled via the communication path 168, as will be described in further detail below. In some embodiments, the one or more processors 162, the one or more memory modules 164, the temperature sensor 166, and/or the power supply 170 are included within a single device. In other embodiments, the one or more processors 162, the one or more memory modules 164, the temperature sensor 166, and/or the power supply 170 may be distributed among multiple devices that are communicatively coupled. For example, in some embodiments, the one or more processors 162 and the one or more memory modules 164 are included in a remote device that wirelessly communicates with other elements, e.g., the temperature sensor 166 and the power supply 170.

The controller 160 includes the one or more memory modules 164 that store a set of machine readable instructions. The one or more processors 162 execute the machine readable instructions stored in the one or more memory modules 164. The one or more memory modules 164 may comprise RAM, ROM, flash memories, hard drives, or any device capable of storing machine readable instructions such that the machine readable instructions can be accessed by the one or more processors 162. The machine readable instructions comprise logic or algorithm(s) written in any programming language of any generation (e.g., 1GL, 2GL, 3GL, 4GL, or 5GL) such as, for example, machine language that may be directly executed by the one or more processors 162, or assembly language, object-oriented programming (OOP), scripting languages, microcode, etc., that may be compiled or assembled into machine readable instructions and stored in the one or more memory modules 164. Alternatively, the machine readable instructions may be written in a hardware description language (HDL), such as logic implemented via either a field-programmable gate array (FPGA) configuration or an application-specific integrated circuit (ASIC), or their equivalents. Accordingly, the methods described herein may be implemented in any conventional computer programming language, as pre-programmed hardware elements, or as a combination of hardware and software components. The one or more memory modules 164 may be implemented as one memory module or a plurality of memory modules.

The one or more memory modules 164 include instructions for executing the functions of the system 100. The instructions may include instructions for receiving a temperature measured by the temperature sensor 166, and instructions for providing a voltage determined based on the temperature of the power electronic device across the piezoelectric substrate 140. The voltage may be a function of the temperature measured by the temperature sensor 166.

The one or more processors 162 may be any device capable of executing machine readable instructions. For example, the one or more processors 162 may be an integrated circuit, a microchip, a computer, or any other computing device. The one or more memory modules 164 and the one or more processors 162 are coupled to a communication path 168 that provides signal interconnectivity between various components and/or modules of the controller 160. Accordingly, the communication path 168 may communicatively couple any number of processors with one another, and allow the modules coupled to the communication path 168 to operate in a distributed computing environment. Specifically, each of the modules may operate as a node that may send and/or receive data. As used herein, the term "communicatively coupled" means that coupled components are capable of exchanging data signals with one another such as, for example, electrical signals via conductive medium, electromagnetic signals via air, optical signals via optical waveguides, and the like.

Accordingly, the communication path 168 may be formed from any medium that is capable of transmitting a signal such as, for example, conductive wires, conductive traces, optical waveguides, or the like. Moreover, the communication path 168 may be formed from a combination of mediums capable of transmitting signals. In some embodiments, the communication path 168 comprises a combination of conductive traces, conductive wires, connectors, and buses that cooperate to permit the transmission of electrical data signals to components such as processors, memories, sensors, input devices, output devices, and communication devices. Additionally, it is noted that the term "signal" means a waveform (e.g., electrical, optical, magnetic, mechanical or electromagnetic), such as DC, AC, sinusoidal-wave, triangular-wave, square-wave, vibration, and the like, capable of traveling through a medium.

The temperature sensor 166 is coupled to the communication path 168 and communicatively coupled to the one or more processors 162 and the one or more memory modules 164. The temperature sensor 166 is configured to measure the temperature of the power electronic device 102. In some embodiments, the temperature sensor 166 may be placed on the power electronic device 102 and wirelessly transmit the measured temperature to the controller 160. In other embodiments, the temperature sensor 166 is coupled to the semiconductor device 110. In other embodiments, the temperature sensor 166 is coupled to another component of the power electronic device 102.

The power supply 170 is configured to supply a voltage to the piezoelectric substrate 140 that is determined based on the temperature of the power electronic device 102. As the temperature of the power electronic device 102 increases, the voltage supplied by the power supply 170 to the piezoelectric substrate 140 increases. In embodiments, when the metal substrate 130 is subject to a high temperature (e.g., 150 Celsius degrees to 200 Celsius degrees), the metal substrate 130 may be deformed as shown in FIG. 2A, as the operating temperature of the power electronic device increases. In order to prevent the deformation of the metal substrate 130, the power supply 170 applies a voltage +V1 and a voltage −V1 across the piezoelectric substrate 140 to induce a mechanical strain in a direction opposite to the strain of the metal substrate 130, such that the mechanical strain of the piezoelectric substrate 140 at least partially cancels out or reduces the mechanical strain of the metal substrate 130. The value of voltage V1 is determined based on the measured temperature of the power electronic device 102. For example, the voltage applied by the power supply 170 may be a function of the measured temperature (e.g., a value proportional to the measured temperature).

In embodiments, when the metal substrate 130 is subject to a low temperature (e.g., a temperature lower than room temperature), the metal substrate 130 may be deformed as shown in FIG. 2B as the operating temperature of the power electronic device decreases. In order to prevent the deformation of the metal substrate 130, the power supply 170 applies a voltage +V2 and a voltage −V2 across the piezoelectric substrate 140 to induce a mechanical strain in a direction opposite to the strain of the metal substrate 130, such that the mechanical strain of the piezoelectric substrate 140 at least partially cancels out or reduces the mechanical strain of the metal substrate 130. The value of voltage V2 is determined based on the measured temperature of the power electronic device 102.

Figure 3:
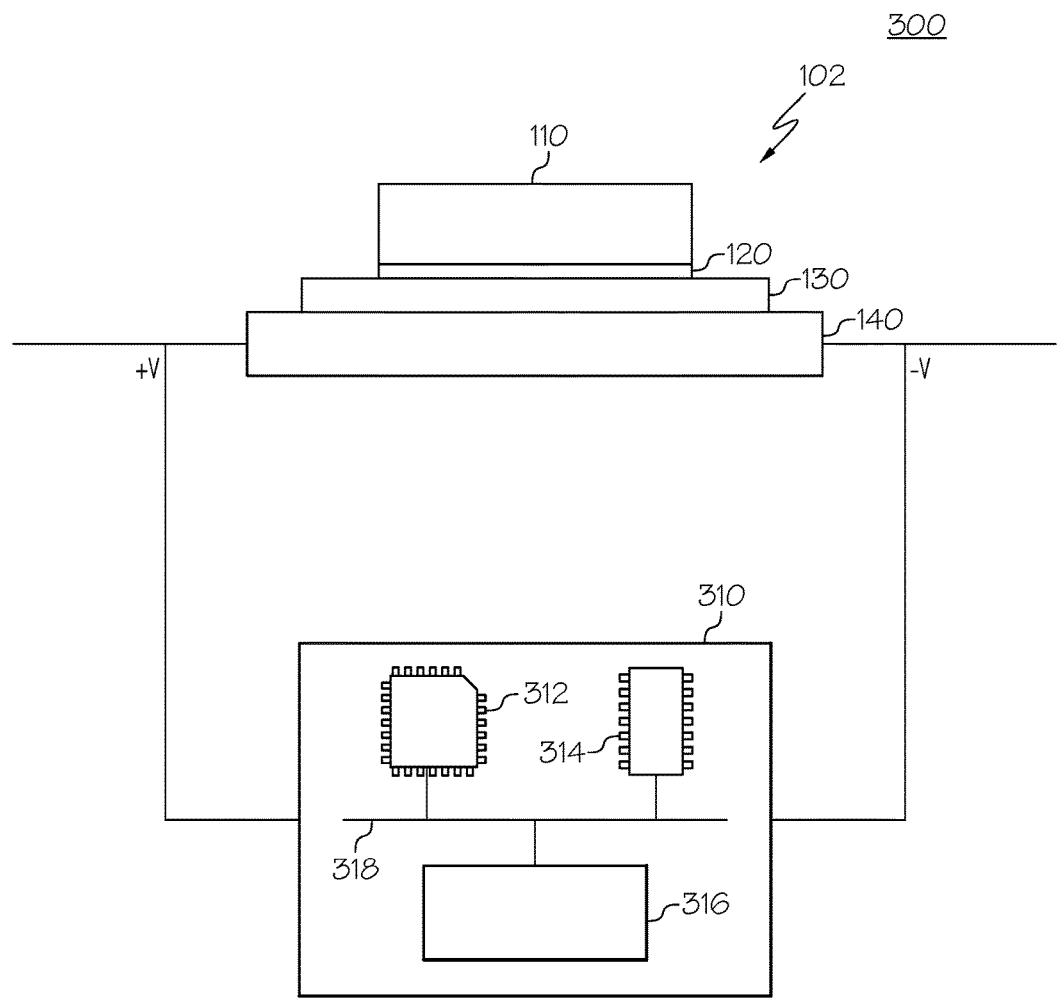
FIG. 3 schematically depicts a system for monitoring a defect in a power electronic device, according to another embodiment shown and described herein.

FIG. 3 schematically depicts a system 300 for monitoring a defect in a power electronic device, according to another embodiment shown and described herein. The system 300 includes the power electronic device 102 and a controller 310. The power electronic device 102 may be included in a vehicle system such as a hybrid vehicle system or an electric vehicle system. The power electronic device 102 includes the semiconductor device 110, the bonding layer 120, the metal substrate 130, and the piezoelectric substrate 140. The metal substrate 130 is coupled to the piezoelectric substrate 140 (e.g., such as embodiments in which the metal substrate 130 is deposited on the piezoelectric substrate 140). The semiconductor device 110 and the metal substrate 130 are bonded to each other through the bonding layer 120.

The metal substrate 130 may be subject to thermal stresses caused by coefficient of thermal expansion (CTE) mismatch between the metal substrate 130 and the semiconductor device 110, as the operating temperature of the power electronic device 102 increases.

The piezoelectric substrate 140 may be a thin piezoelectric substrate (e.g., a lead zirconate titanate (PZT) substrate). A constant voltage (e.g., +V in FIG. 3) may be applied across the piezoelectric substrate 140. When the metal substrate 130 is deformed to cause a crack in the bonding layer 120, the piezoelectric substrate 140, which is attached to the metal substrate 130, is also deformed, and thereby causing a change in the voltage across the piezoelectric substrate 140. The change in the voltage of the piezoelectric substrate 140 is detected by the controller 310.

The controller 310 includes one or more processors 312, one or more memory modules 314, a voltage meter 316, and a communication path 318. The various components of the controller 310 will now be described.

The controller 310 includes one or more processors 312 and one or more memory modules 314 to which various components are communicatively coupled, as will be described in further detail below. In some embodiments, the one or more processors 312, the one or more memory modules 314, and/or the voltage meter 316 are included within a single device. In other embodiments, the one or more processors 312, the one or more memory modules 314, and/or the voltage meter 316 may be distributed among multiple devices that are communicatively coupled. For example, the one or more processors 312 and the one or more memory modules 314 are included in a remote device that wirelessly communicates with other elements, e.g., the voltage meter 316.

The controller 310 includes the one or more memory modules 314 that store a set of machine readable instructions. The one or more processors 312 execute the machine readable instructions stored in the one or more memory modules 314. The one or more memory modules 314 may comprise RAM, ROM, flash memories, hard drives, or any device capable of storing machine readable instructions such that the machine readable instructions can be accessed by the one or more processors 312. The machine readable instructions comprise logic or algorithm(s) written in any programming language of any generation (e.g., 1GL, 2GL, 3GL, 4GL, or 5GL) such as, for example, machine language that may be directly executed by the one or more processors 312, or assembly language, object-oriented programming (OOP), scripting languages, microcode, etc., that may be compiled or assembled into machine readable instructions and stored in the one or more memory modules 314. Alternatively, the machine readable instructions may be written in a hardware description language (HDL), such as logic implemented via either a field-programmable gate array (FPGA) configuration or an application-specific integrated circuit (ASIC), or their equivalents. Accordingly, the methods described herein may be implemented in any conventional computer programming language, as pre-programmed hardware elements, or as a combination of hardware and software components. The one or more memory modules 314 may be implemented as one memory module or a plurality of memory modules.

The one or more memory modules 314 include instructions for executing the functions of the system 300. The instructions may include instructions for monitoring a voltage across the piezoelectric substrate using, e.g., the voltage meter 316, instructions for determining whether the voltage across the piezoelectric substrate changed, and instructions for determining that the power electronic device has a defect in response to determination that the voltage across the piezoelectric substrate changed. Thus, by detecting the change in the voltage of the piezoelectric substrate 140, the system 300 has a prognostic function of determining whether the power electronic device 102 has defects or not.

The one or more processors 312 may be any device capable of executing machine readable instructions. For example, the one or more processors 312 may be an integrated circuit, a microchip, a computer, or any other computing device. The one or more memory modules 314 and the one or more processors 312 are coupled to a communication path 318 that provides signal interconnectivity between various components and/or modules of the controller 310. Accordingly, the communication path 318 may communicatively couple any number of processors with one another, and allow the modules coupled to the communication path 318 to operate in a distributed computing environment. Specifically, each of the modules may operate as a node that may send and/or receive data. As used herein, the term "communicatively coupled" means that coupled components are capable of exchanging data signals with one another such as, for example, electrical signals via conductive medium, electromagnetic signals via air, optical signals via optical waveguides, and the like.

Accordingly, the communication path 318 may be formed from any medium that is capable of transmitting a signal such as, for example, conductive wires, conductive traces, optical waveguides, or the like. Moreover, the communication path 318 may be formed from a combination of mediums capable of transmitting signals. In some embodiments, the communication path 318 comprises a combination of conductive traces, conductive wires, connectors, and buses that cooperate to permit the transmission of electrical data signals to components such as processors, memories, sensors, input devices, output devices, and communication devices. Additionally, it is noted that the term "signal" means a waveform (e.g., electrical, optical, magnetic, mechanical or electromagnetic), such as DC, AC, sinusoidal-wave, triangular-wave, square-wave, vibration, and the like, capable of traveling through a medium.

The voltage meter 316 is configured to measure a voltage across the piezoelectric substrate 140. The voltage meter 316 transmits the measured voltage to the one or more processors 312 and/or the one or more memory modules 314. In some embodiments, the voltage meter 316 may be placed on the power electronic device 102 and wirelessly transmit the measured temperature to the controller 310.

In embodiments, the system 300 monitors the voltage across the piezoelectric substrate 140 by using the voltage meter 316. If the voltage across the piezoelectric substrate 140 is changed by more than a predetermined amount (e.g., increased by more than 0.5 mV or decreased by more than 0.5 mV), the one or more processors 302 determines that the power electronic device 102 has defects. In some embodiments, the system 300 determines whether the voltage across the piezoelectric substrate 140 is changed by more than a predetermined amount during a certain period of time (e.g., increased by more than 0.5 mV or decreased by more than 0.5 mV during one second). If the voltage across the piezoelectric substrate 140 is changed by more than the predetermined amount during the certain period of time, the one or more processors 302 determines that the power electronic device 102 has defects.

A system for protecting a power electronic device is provided. The system includes a power electronic device and a controller. The power electronic device includes a piezoelectric substrate, a metal substrate coupled to the piezoelectric substrate, a semiconductor device, and a bonding layer positioned between the metal substrate and the semiconductor device such that the metal substrate is bonded to the semiconductor device. The controller includes a power supply, one or more processors, and one or more memory modules storing computer readable and executable instructions. The computer readable and executable instructions, when executed by the one or more processors, cause the controller to: receive a temperature of the power electronic device, and provide a voltage determined based on the temperature of the power electronic device across the piezoelectric substrate. According to the system of the present disclosure, a mechanical strain applied to the piezoelectric substrate 140 substantially cancels out or reduces the mechanical strain applied to the metal substrate 130. Thus, the metal substrate 130 is rarely deformed even when the operating temperature of the power electronic device 102 increases above a predetermined temperature or decreases below the predetermine temperature. Thus, the system substantially reduces the likelihood that the bonding layer 120 is subject to cyclic strain and fatigue failure. In addition, by detecting the change in the voltage of the piezoelectric substrate 140, the system of the present disclosure has a prognostic function of determining whether the power electronic device 102 has defects or not.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is, therefore, intended that the appended claims cover all such changes and modifications that are within the scope of the claimed subject matter.

What is claimed is:

1. A system for protecting a power electronic device, the system comprising:

a power electronic device comprising:
   a piezoelectric substrate;
   a metal substrate coupled to the piezoelectric substrate;
   a semiconductor device; and
   a bonding layer positioned between the metal substrate and the semiconductor device such that the metal substrate is bonded to the semiconductor device; and
a controller comprising:
   a power supply;
   one or more processors; and
   one or more memory modules storing computer readable and executable instructions which, when executed by the one or more processors, cause the controller to:
      receive a temperature of the power electronic device; and
      provide a voltage determined based on the temperature of the power electronic device across the piezoelectric substrate.

2. The system of claim 1, wherein the piezoelectric substrate includes a lead zirconate titanate substrate.

3. The system of claim 1, further comprising a temperature sensor configured to measure the temperature of the power electronic device.

4. The system of claim 1, wherein the semiconductor device is a silicon carbide (SiC) device.

5. The system of claim 1, wherein when the temperature of the power electronic device is higher than a predetermined temperature, the metal substrate is subject to a first mechanical strain, and the voltage provided across the piezoelectric substrate creates a second mechanical strain in a direction that is opposite to a direction of the first mechanical strain.

6. The system of claim 5, wherein the second mechanical strain at least partially cancels out or reduces the first mechanical strain.

7. The system of claim 1, wherein when the temperature of the power electronic device is lower than a predetermined temperature, the metal substrate is subject to a third mechanical strain, and the voltage provided across the piezoelectric substrate creates a fourth mechanical strain in a direction that is opposite to a direction of the third mechanical strain.

8. The system of claim 7, wherein the fourth mechanical strain at least partially cancels out or reduces the third mechanical strain.

9. A power electronic device comprising:
a piezoelectric substrate;
a metal substrate coupled to the piezoelectric substrate;
a semiconductor device; and
a bonding layer positioned between the metal substrate and the semiconductor device such that the metal substrate is bonded to the semiconductor device,
wherein the piezoelectric substrate is configured to generate a mechanical strain in response to electric current passing through the piezoelectric substrate.

10. The power electronic device of claim 9, wherein the piezoelectric substrate includes a lead zirconate titanate substrate.

11. The power electronic device of claim 9, wherein the semiconductor device is a silicon carbide (SiC) device.

12. The power electronic device of claim 9, wherein when a temperature of the power electronic device is higher than a predetermined temperature, the metal substrate is subject to a first mechanical strain, and the electric current passing through the piezoelectric substrate creates a second mechanical strain in a direction that is opposite to a direction of the first mechanical strain.

13. The power electronic device of claim 12, wherein the second mechanical strain at least partially cancels out or reduces the first mechanical strain.

14. The power electronic device of claim 9, wherein when a temperature of the power electronic device is lower than a predetermined temperature, the metal substrate is subject to a third mechanical strain, and the electric current passing through the piezoelectric substrate creates a fourth mechanical strain in a direction that is opposite to a direction of the third mechanical strain.

15. The power electronic device of claim 14, wherein the fourth mechanical strain at least partially cancels out or reduces the third mechanical strain.

16. The power electronic device of claim 14, wherein the piezoelectric substrate is configured to generate the mechanical strain in a direction opposite to a direction of a mechanical strain of the metal substrate in response to electric current passing through the piezoelectric substrate.

17. A system for monitoring a defect in a power electronic device, the system comprising:
a power electronic device comprising:
   a piezoelectric substrate;
   a metal substrate coupled to the piezoelectric substrate;
   a semiconductor device; and
   a bonding layer positioned between the metal substrate and the semiconductor device such that the metal substrate is bonded to the semiconductor device; and
a controller comprising:
   one or more processors; and
   one or more memory modules storing computer readable and executable instructions which, when executed by the one or more processors, cause the controller to:
   determine whether a voltage across the piezoelectric substrate changes; and
   determine that the power electronic device has a defect in response to determination that the voltage across the piezoelectric substrate changes.

18. The system of claim 17, wherein the piezoelectric substrate includes a lead zirconate titanate substrate.

19. The system of claim 17, wherein the defect includes a defect in the bonding layer.

20. The system of claim 17, wherein the semiconductor device is a silicon carbide (SiC) device.

\* \* \* \* \*